United States Patent [19]
Okonogi

[11] Patent Number: 5,773,152
[45] Date of Patent: Jun. 30, 1998

[54] SOI SUBSTRATE HAVING A HIGH HEAVY METAL GETTERING EFFECT FOR SEMICONDUCTOR DEVICE

[75] Inventor: Kensuke Okonogi, Tokyo, Japan

[73] Assignee: NEC Corporation, Tokyo, Japan

[21] Appl. No.: 543,068

[22] Filed: Oct. 13, 1995

[30] Foreign Application Priority Data

Oct. 13, 1994 [JP] Japan .................................. 6-273132

[51] Int. Cl.$^6$ ...................................................... B32B 9/04
[52] U.S. Cl. ...................... 428/446; 428/448; 428/700; 428/701; 428/702; 257/347; 257/349; 257/353
[58] Field of Search ................................ 257/66, 67, 70, 257/347, 349, 353; 428/446, 448, 700, 701, 702

[56] References Cited

U.S. PATENT DOCUMENTS

| | | | |
|---|---|---|---|
| 4,754,314 | 6/1988 | Scott | 257/70 |
| 4,916,504 | 4/1990 | Nakahara | 257/70 |
| 5,063,113 | 11/1991 | Wada | 428/446 |

FOREIGN PATENT DOCUMENTS

| | | |
|---|---|---|
| 2-037771 | 2/1990 | Japan . |
| 2-237121 | 9/1990 | Japan . |
| 4-199632 | 7/1992 | Japan . |
| 6-163862 | 6/1994 | Japan . |

*Primary Examiner*—Timothy Speer
*Attorney, Agent, or Firm*—Foley & Lardner

[57] ABSTRACT

An SOI substrate comprises a buried silicon oxide layer formed directly under an active silicon layer, and a layer containing phosphorus therein formed under the buried silicon oxide layer. The layer containing phosphorus therein acts as the getter layer, so that an effective gettering of heavy metals can be obtained in a wide temperature range from a low temperature region to a high temperature region. In addition, since the silicon oxide layer exists between the active layer and the getter layer, the diffusion of the phosphorus into the active layer is effectively prevented, and therefore, the phosphorus scarely diffuses to the active layer, so that the device manufactured is subjected to almost no adverse influence of the diffusion of the phosphorus.

12 Claims, 8 Drawing Sheets

- 73 SILICON SUBSTRATE
- 72 SILICON DIOXIDE FILM
- 74 POLYSILICON
- 75 SILICON DIOXIDE FILM
- 71 SILICON SUBSTRATE

- 83 SILICON SUBSTRATE
- 84 PHOSPHORUS DIFFUSED LAYER
- 82 SILICON DIOXIDE FILM
- 81 SILICON SUBSTRATE

- 13 SILICON LAYER (ACTIVE LAYER)
- 12 SILICON DIOXIDE FILM
- 11 SILICON LAYER
- 14 HIGH CONCENTRATION PHOSPHORUS DIFFUSED LAYER (GETTER LAYER)

SOI SUBSTRATE HAVING A HIGH HEAVY METAL GETTERING EFFECT FOR SEMICONDUCTOR DEVICE

BACKGROUND OF THE INVENTION

1. Field of the Invention

The present invention relates to a semiconductor device, and more specifically to an SOI (silicon on insulator) substrate for use in a semiconductor device and having a gettering effect for heavy metals.

2. Description of Related Art

The SOI substrate has been used as a substrate for manufacturing various high performance semiconductor devices, since it can realize a high α-ray resisitivity, latch-up resistance and a low parasitic capacitance. One problem encountered in using the SOI substrate in a semiconductor device is a gettering in connection with heavy metal contamination. Differently front conventional silicon substrates, the SOI substrate includes a buried silicon dioxide film just under a device formation region. Since a diffusion speed of heavy metals in the silicon dioxide film is lower than that in the silicon, it is difficult to cause the heavy metals in the device formation region to be diffused to a gettering site region so that the heavy metals are captured or trapped by the gettering site region. Therefore, various types of SOI substrates having the gettering effect have been proposed in the prior art.

Referring to FIG. 1, there is shown a diagrammatic sectional view of the SOI substrate proposed by Japanese Patent Application Laid-open Publication No. Heisei 2-037771, the disclosure of which is incorporated by reference in its entirety into this application. In this SOI substrate, an intrinsic gettering (IG) treatment is performed for a silicon substrate 54, by carrying out a heat treatment for example under 450° C. for five hours and under 1100° C. for one hour, so that bulk micro defects (abbreviated to "BMD" hereinafter) 56 composed of $SiO_2$ are precipitated as gettering sites. Then, a silicon dioxide film 52 having a thickness on the order of 0.2 μm is formed on a rear surface of the silicon substrate 54, and is stuck on a silicon dioxide film 55 formed on another silicon substrate 51. Furthermore, a surface of the silicon substrate 54 is ground so that the silicon substrate 54 is thinned to a thickness of about 3 μm, and then, a silicon layer 53 having a thickness of about 1 μm is epitaxially grown on the silicon substrate 54.

In this SOI substrate, the silicon substrate 54 functions as a getter layer, but since the silicon substrate 54 is as thin as about 3 μm in thickness, the intrinsic gettering (IG) effect is low. In addition, since the getter layer 54 is adjacent to the epitaxial silicon layer 53 which forms a device formation region, the heavy metal trapped in the getter layer 54 is released in the process of a heat treatment performed for a device manufacturing, so that the heavy metal is mixed again into the device formation region 53, with the result that the characteristics of the devices completed is deteriorated. Furthermore, since the IG treatment and the silicon epitaxial growth are required, the manufacturing cost becomes high.

Referring to FIG. 2, there is shown a diagrammatic sectional view of the SOI substrate proposed by Japanese Patent Application Laid-open Publication No. Heisei 2-237121, the disclosure of which is incorporated by reference in its entirety into this application. In this SOI substrate, silicon dioxide films 62 are formed partially on a silicon substrate 61 by a selective oxidation, and a surface of the substrate 61 is planarized by etching the formed silicon dioxide films 62 using a resist having the same etching speed as that of the silicon dioxide films 62. Thereafter, another silicon substrate 63 is stuck on the planarized surface of the silicon substrate 61, and a heat treatment is performed to firmly bond the substrates 61 and 63 to each other. Then, a surface of the silicon substrate 63 is ground to have a thickness of about 30 μm to 50 μm. Thereafter, the IG treatment is performed, so that BMDs 64 are precipitated in the inside of the silicon substrate 61. Namely, a getter layer is formed.

In this SOI substrate, it is difficult to planarize the surface of the substrate by etching the silicon dioxide films 62, and particularly, it is extremely difficult to make the step difference not greater than 500 Å. Therefore, voids are apt to occur in the step difference portions when the silicon substrate 63 is stuck on the surface of the substrate 61. These voids easily become a cause of varying the characteristics of the manufactured devices in a heat treatment process performed at a later stage. In addition, when the devices are formed by isolating the devices with an insulator, the effect of gettering the heavy metals mixed in the device formation regions is decreased dependently upon a positional relation between the device isolation regions and the silicon dioxide films 62.

Referring to FIG. 3, there is shown a diagrammatic sectional view of the SOI substrate proposed by Japanese Patent Application Laid-open Publication No. Heisei 4-199632, the disclosure of which is incorporated by reference in its entirety into this application. In this SOI substrate, a silicon dioxide film 75 having a thickness of 20 μm is formed on a silicon substrate 71, and a polysilicon film 74 having a thickness on the order of 500 nm is formed on the silicon dioxide film 75. Furthermore, a silicon dioxide film 72 having a thickness of about 1 μm is formed on the polysilicon film 74. Another silicon substrate 73 is stuck on the silicon dioxide film 72, and a heat treatment is performed. Thereafter, the silicon substrate 73 is ground so as to constitute an active layer having a thickness of 1 μm.

In this SOI substrate, the polysilicon film 74 is used as a getter site, and the gettering effect of the polysilicon is easily influenced by temperature. Therefore, when this SOI substrate is used in devices which require a large number of heat treatment steps for manufacturing, the gettering effect inevitably drops. In particular, since the gettering effect of the polysilicon remarkably decreases at the temperature of 800° C., the process condition for the device manufacturing is restricted.

In the conventional SOI substrates mentioned above, there are many restraints in actually manufacturing the devices, and in addition, the gettering effect is apt to easily decrease. Under this circumstance, the applicant of the present application made various studies, and discovered that a layer containing phosphorus therein effectively functions as the getter layer. Then, in Japanese Patent Application No. 318983/1992 filed on Nov. 27, 1994 published on Jun. 10, 1994 under Japanese Patent Application Laid-open Publication No. Heisei 6-163862, the disclosure of which is incorporated by reference in its entirely into this application, the applicant proposed an SOI substrate having a getter layer composed of a high concentration phosphorus diffused layer.

Referring to FIG. 4, there is shown a diagrammatic sectional view of the SOI substrate proposed by the applicant of the present application. In the shown SOI substrate, a high concentration phosphorus diffused layer 84 is formed in a surface of a silicon substrate 83 by means of an ion-implantation or a solid phase diffusion process. Then, a silicon dioxide film 82 is formed on a surface of another silicon substrate 81, and the silicon dioxide film 82 is faced to the high concentration phosphorus diffused layer 84, and the silicon substrate 81 is stuck and firmly bonded onto the silicon substrate 83 by means of a heat treatment. Thereafter, the silicon substrate 83 is ground to a desired thickness so as to constitute a device formation region.

In this SOI substrate, it has been ascertained that the high concentration phosphorus diffused layer 84 effectively functions as the getter layer for the heavy metals. However, the applicant of the present application has made a further study, and found that the SOI substrate gives constraint to various device manufacturing steps, for the following reasons: Since the getter layer 84 exists adjacent to and directly under the silicon layer 83 which acts as the device formation region, phosphorus diffuses into the device formation region by the heat treatment for sticking the silicon substrates 81 and 83 to each other and by heat treatments performed at later stages in the device manufacturing process. Therefore, it is necessary to control the device manufacturing process for the purpose of ensuring that the profile of the phosphorus diffusion concentration never influences the device characteristics.

SUMMARY OF THE INVENTION

Accordingly, it is an object of the present invention to provide an SOI substrate which has overcome the above mentioned defect of the conventional ones.

Another object of the present invention is to provide an SOI substrate capable of ensuring an effective gettering effect and at the same time capable of minimizing adverse influence on the device through diffusion of impurity such as phosphorus included in the getter layer.

The above and other objects of the present invention are achieved in accordance with the present invention by a silicon-on-insulator substrate comprising an active silicon layer, a buried silicon oxide layer formed directly under the active silicon layer, and an impurity layer containing a high concentration of impurity therein and formed under the buried silicon oxide layer.

The impurity layer can be formed of a single crystalline silicon layer containing a high concentration of impurity therein, a polysilicon layer containing a high concentration of impurity therein, a silicon oxide layer containing a high concentration of impurity therein, or an N-type silicon substrate containing a high concentration of impurity therein.

In addition, the silicon-on-insulator substrate can further include a silicon substrate layer between the buried silicon oxide layer and the impurity layer, or alternatively, a silicon substrate layer formed under the impurity layer.

In one preferred embodiment, the impurity layer has a plurality of island-like recesses formed on an upper surface thereof, and the silicon oxide layer is formed to cover the upper surface of the impurity layer including the plurality of island-like recesses. The active silicon layer is divided into a plurality of island-like active regions each located in and partitioned by one of the plurality of island-like recesses.

Preferably, the impurity contained in the impurity layer is one selected from the group consisting of phosphorus, boron and arsenic.

The above and other objects, features and advantages of the present invention will be apparent from the following description of preferred embodiments of the invention with reference to the accompanying drawings.

DESCRIPTION OF THE PREFERRED EMBODIMENTS

Figure 1:
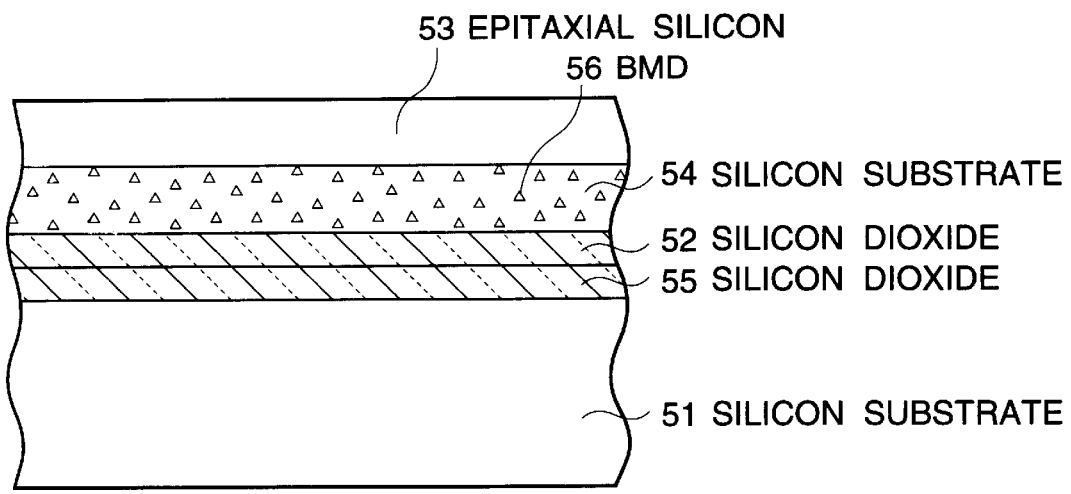
FIG. 1 is a diagrammatic sectional view of a first example of the SOI substrate in the prior art.
Figure 2:
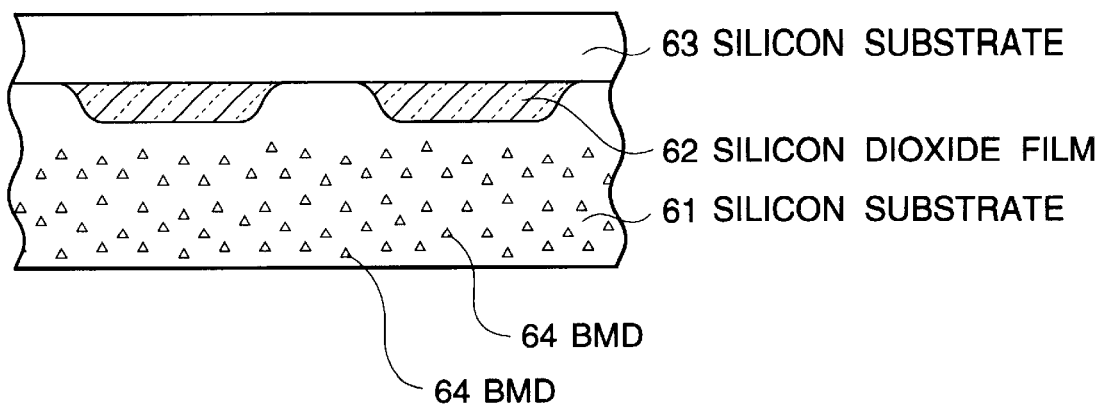
FIG. 2 is a diagrammatic sectional view of a second example of the SOI substrate in the prior art.
Figure 3:
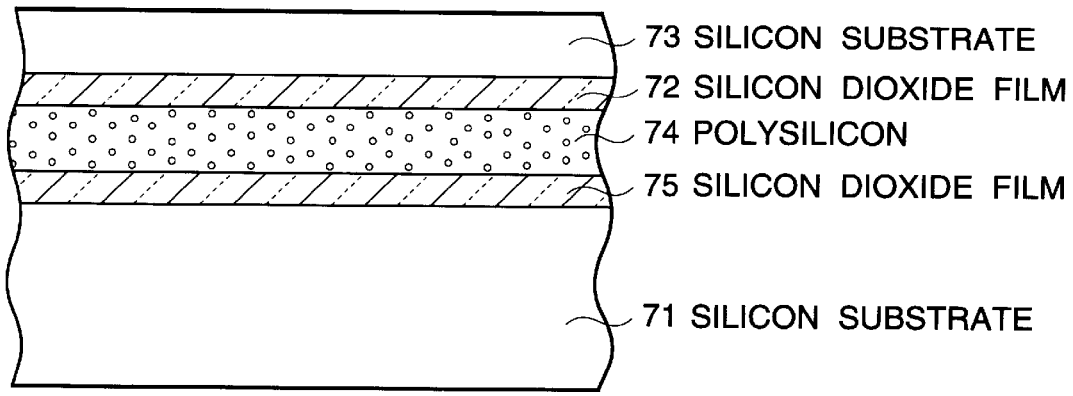
FIG. 3 is a diagrammatic sectional view of a third example of the SOI substrate in the prior art.
Figure 4:
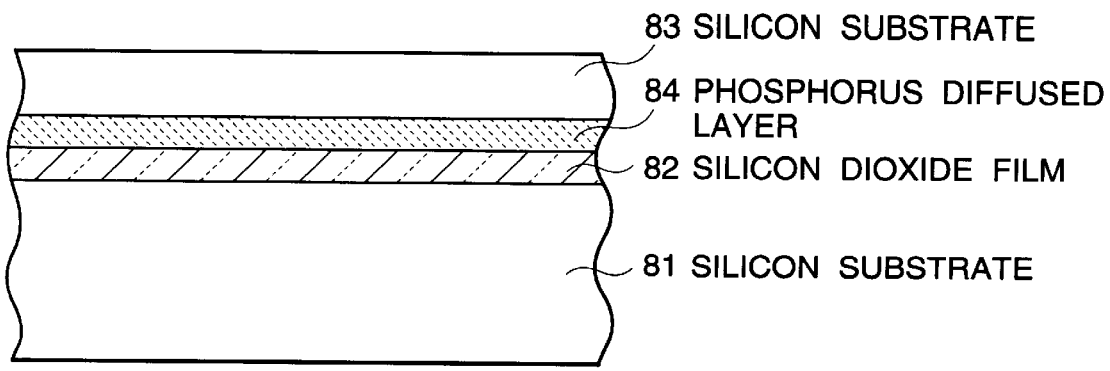
FIG. 4 is a diagrammatic sectional view of a fourth example of the SOI substrate in the prior art.
Figure 5:
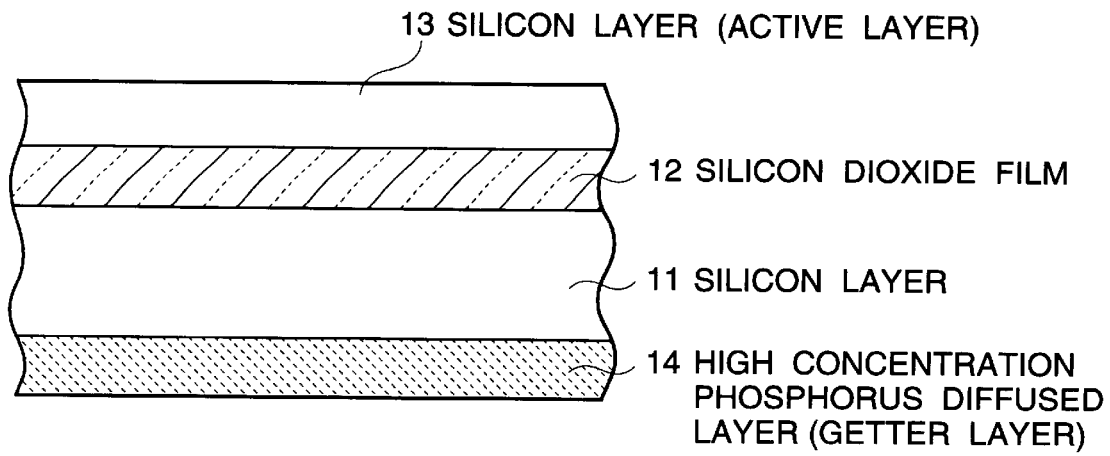
FIG. 5 is a diagrammatic sectional view of a first embodiment of the SOI substrate in accordance with the present invention.

Referring to FIG. 5, there is shown a diagrammatic sectional view of a first embodiment of the SOI substrate in accordance with the present invention.

A silicon layer 11 is prepared as a support substrate, and a silicon dioxide film 12 is formed on a surface of the silicon layer 11. Furthermore, a silicon layer 13 is formed as an active layer 13 on the silicon dioxide film 12. As a getter layer, a high concentration phosphorus diffused (single crystalline silicon) layer 14 is formed on a rear surface of the silicon layer 11 used as the support substrate.

Here, the thickness of each of the silicon layer 13 (as the active layer) and the silicon dioxide film 12 is set in accordance with the device to be manufactured. In the case of a power device, the thickness of the silicon layer 13 is set to be a few 10 $\mu$m, and the thickness of the silicon dioxide film 12 is set to be a few $\mu$m. In the case of a bipolar device and a BiMOS device, the thickness of the silicon layer 13 is set to be a few $\mu$m, and the thickness of the silicon dioxide film 12 is set to be 0.1 $\mu$m to 1 $\mu$m. In the case of a CMOS device, the thickness of the silicon layer 13 is set to be 0.05 $\mu$m to 0.5 $\mu$m, and the thickness of the silicon dioxide film 12 is set to be 0.05 $\mu$m to 0.5 $\mu$m.

The high concentration phosphorus diffused layer 14 is formed to have a phosphorus concentration substantially equal to that of the high concentration phosphorus diffused layer obtained by ion-implanting phosphorus at a dose of $1 \times 10^{15}$ cm$^{-2}$, which was performed in manufacturing the SOI substrate disclosed in the Japanese patent application mentioned hereinbefore of the applicant of the present application.

Referring to FIG. 6A to 6D, there are shown diagrammatic sectional views illustrating a process for forming the first embodiment of the SOI substrate in accordance with the present invention as shown in FIG. 5.

Figure 6A:
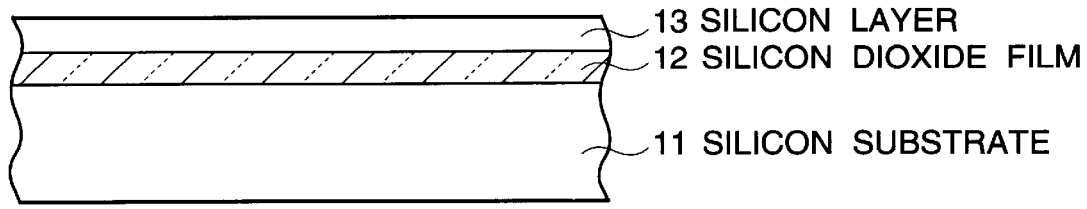
FIG. 6A to 6D are diagrammatic sectional views illustrating a process for forming the first embodiment of the SOI substrate shown in FIG. 5.

First, as shown in FIG. 6A, the silicon substrate having the buried silicon dioxide film 12 is formed by performing either a sticking process or a SIMOX (separation by implanted oxygen) process to the silicon layer 11. For example, in the sticking process, a surface of the silicon layer 11 is thermally oxidized so as to form the silicon dioxide film 12, and then, a silicon substrate constituting the silicon layer 13 is stuck onto the silicon dioxide film 12. Alternatively, in the SIMOX process, oxygen is ion-implanted into the surface of the silicon substrate 11 so that the buried silicon dioxide film 12 and the silicon layer 13 are simultaneously formed.

Figure 6B:
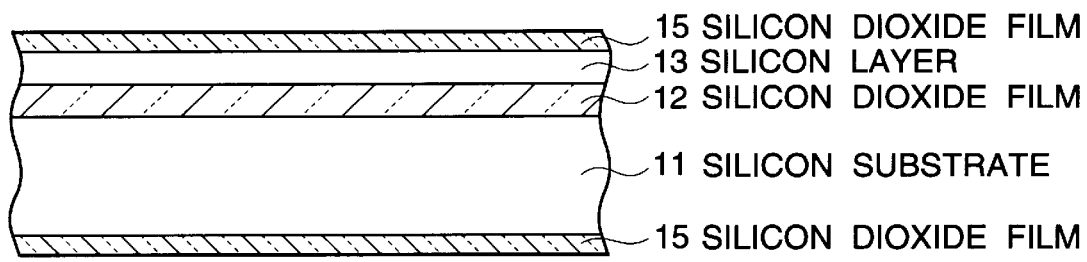

Then, as shown in FIG. 6B, an upper surface and a lower surface of the silicon substrate thus formed are thermally oxidized, so that a silicon dioxide film 15 having a thickness on the order of 500 Å is formed on each of the upper surface and the lower surface of the silicon substrate.

Figure 6C:
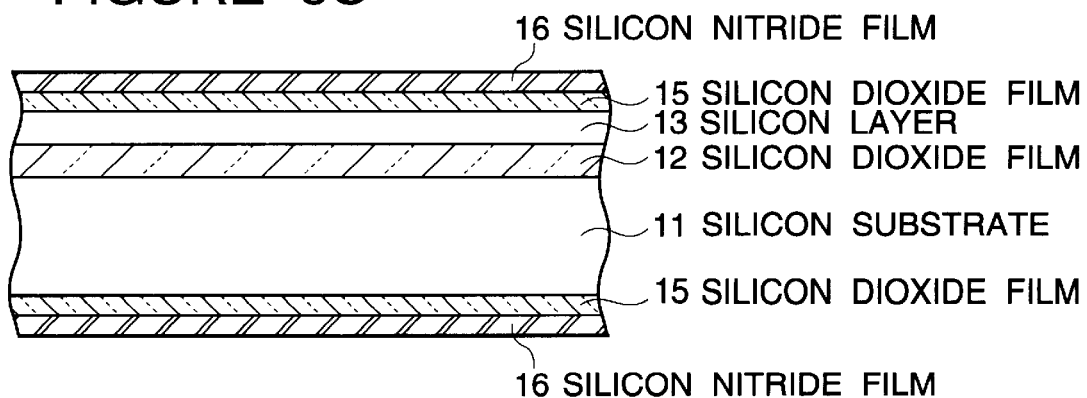

Thereafter, as shown in FIG. 6C, a silicon nitride film 16 having a thickness on the order of 0.1 μm is formed, by means of a CVD process, on the silicon dioxide film 15 formed on each of the upper surface and the lower surface of the silicon substrate.

Then, a resist layer (not shown) is formed to cover the silicon nitride film 16 at the upper surface side of the substrate, and an etching is performed using the resist layer as a mask, so that the silicon nitride film 16 and the silicon dioxide film 15 at the lower surface side of the substrate are removed.

Figure 6D:
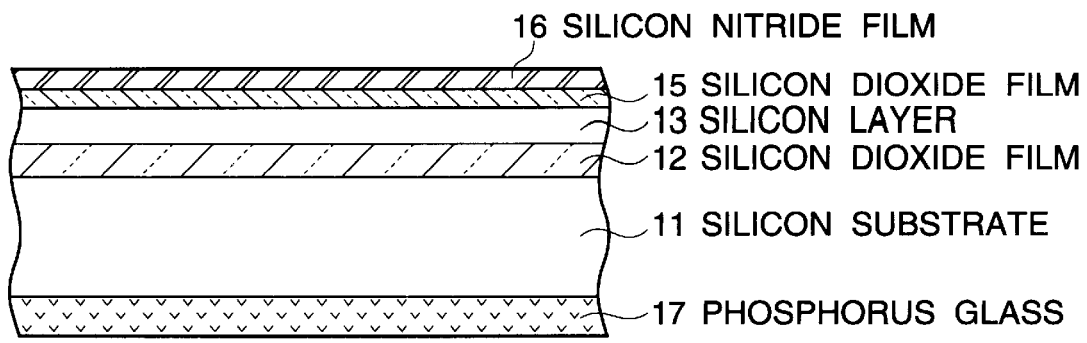

Thereafter, phosphorus is diffused into the lower surface of the silicon layer 11, so as to form the high concentration phosphorus diffused layer 14. For example, POCl$_3$ is bubbled with an N$_2$ gas (20 liter/min), and the obtained gas and an O$_2$ gas are supplied to a furnace maintained at about 900° C. so that as shown in FIG. 6D, a phosphorus glass 17 is formed on the lower surface of the silicon layer 11, and phosphorus is diffused from the phosphorus glass 17 to the silicon layer 11. Then, the phosphorus glass 17 is removed, and furthermore, the silicon nitride film 16 and the silicon dioxide film 15 at the upper surface of the silicon layer 13 are removed. Thus, the SOI substrate shown in FIG. 5 is completed.

In this SOI substrate, since the high concentration phosphorus diffused layer 14 formed on the silicon layer 11 functions as a getter layer, it is possible to ensure a gettering of effectively trapping heavy metals in a wide temperature range from a low temperature to a high temperature (not less than 800° C.). For example, the following test was carried out: A solution containing Cu is applied to the SOI substrate by a spin coating so that the SOI substrate is contaminated with about $1 \times 10^{14}$ cm$^{-2}$. Further, a two-step heat treatment was performed to the SOI substrate contaminated with about $1 \times 10^{14}$ cm$^{-2}$ (N$_2$ treatment for two hours at 1150° C., and O$_2$ treatment for four hours at 1000° C.) and then. "Secco" etching was performed and a surface defect (etch pit) is observed. It was confirmed that the etch pit density was not greater than 10$^3$/cm$^2$, which is smaller than that of the prior art SOI substrate by about one order of magnitude.

In addition, since this SOI substrate is so constituted that the silicon dioxide film is provided just under the silicon layer forming the active layer, and since the high concentration phosphorus diffused layer is provided at a side of the silicon dioxide film opposite to the side adjacent to the active silicon layer, diffusion of the phosphorus into the active layer is prevented. Namely, since the diffusion speed of the phosphorus in the silicon dioxide is 10$^{-15}$ cm$^{-2}$ at 800° C. and 10$^{-13}$ and cm$^{-2}$ at 1000° C., the time required for the phosphorus to transmit through the silicon dioxide film having the thickness of 0.5 μm is about 340 hours at 800° C. and about 200 minutes at 1000° C. In a manufacturing process of 800° C., therefore, the phosphorus scarcely diffuses to the active layer, so that the device manufactured is subjected to almost no adverse influence of the diffusion of phosphorus.

Furthermore, the high concentration phosphorus diffused layer 14 of this SOI substrate can be formed by the step of forming the phosphorus glass 17 and the step of causing the phosphorus to be diffused from the phosphorus glass 17 into the silicon layer 11. Therefore, the SOI substrate of the first embodiment can be manufactured by only adding the above mentioned two steps in the way of the process for manufacturing the conventional SOI substrate. Accordingly, the manufacturing cost can be suppressed, and the SOI substrate having a high quality can be produced with a low cost.

Figure 7:
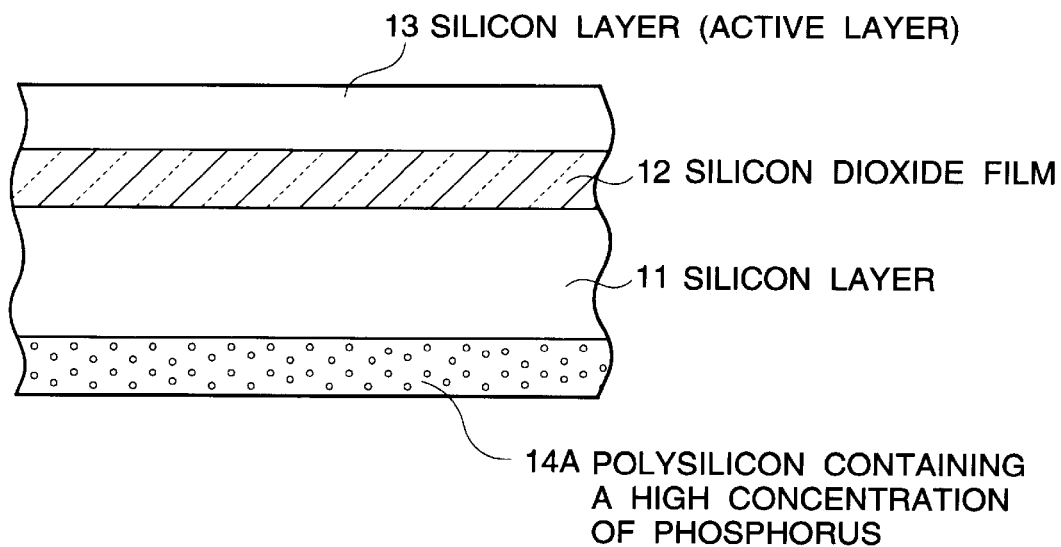
FIG. 7 is a diagrammatic sectional view of a modification of the first embodiment of the SOI substrate shown in FIG. 5.

The first embodiment of the SOI substrate can be modified to include a polysilicon layer 14A containing a high concentration of phosphorus, in place of the high concentration phosphorus diffused layer 14, as shown in FIG. 7. This modification can be realized by forming on the lower surface of the silicon layer 11 the polysilicon layer 14A containing a high concentration of phosphorus and having a thickness of about 1 μm, by means of a LPCVD process, for example under the condition of 645° C. SiH$_4$ (600 cc/min) +PH$_3$ (1%) (100 cc/min), and 100 Torr, in place of the step of forming the phosphorus glass 17 shown in FIG. 6D.

In the structure shown in FIG. 7, it is sufficient if only the polysilicon layer 14A containing a high concentration of phosphorus is formed. Accordingly, the step of diffusing the phosphorus from the phosphorus glass becomes unnecessary, and therefore, the number of the manufacturing steps can be reduced. In addition, since the getter layer is constituted of the polysilicon layer, the gettering effect of the polysilicon itself can be obtained in addition to the gettering effect of the phosphorus, and therefore, the gettering effect can be elevated in total.

Figure 8:
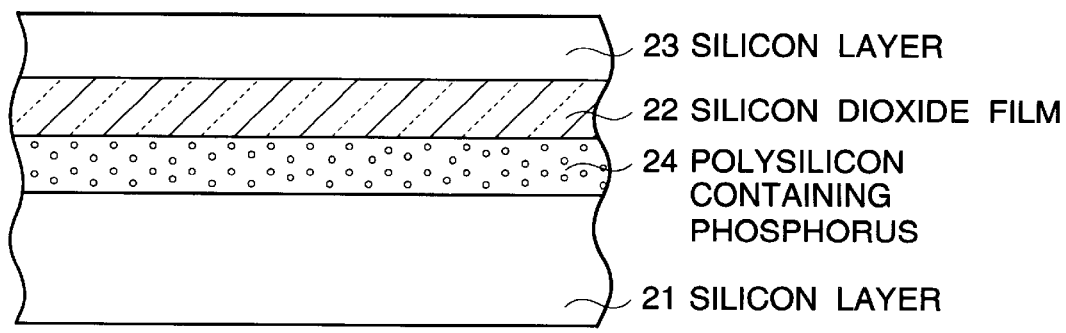
FIG. 8 is a diagrammatic sectional view of a second embodiment of the SOI substrate in accordance the present invention.

Referring to FIG. 8, there is shown a diagrammatic sectional view of a second embodiment of the SOI substrate in accordance with the present invention. The second embodiment includes a polysilicon layer 24 containing phosphorus therein and having a thickness of about 1 μm, formed on a silicon layer 21, a silicon dioxide layer 22 having a thickness of about 0.1 μm to 1 μm, formed on the polysilicon layer 24 and a silicon layer 23 having a thickness of about 0.1 μm to 3 μm, formed on the silicon dioxide layer 22. In this construction, the silicon layer 23 is used as an active layer, and the polysilicon layer 24 containing phosphorus therein functions as the getter layer.

Figure 9A:
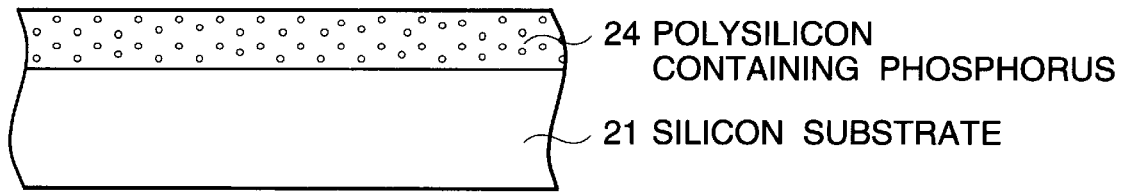
FIG. 9A to 9C are diagrammatic sectional views illustrating a process for forming the second embodiment of the SOI substrate shown in FIG. 8.
Figure 9B:
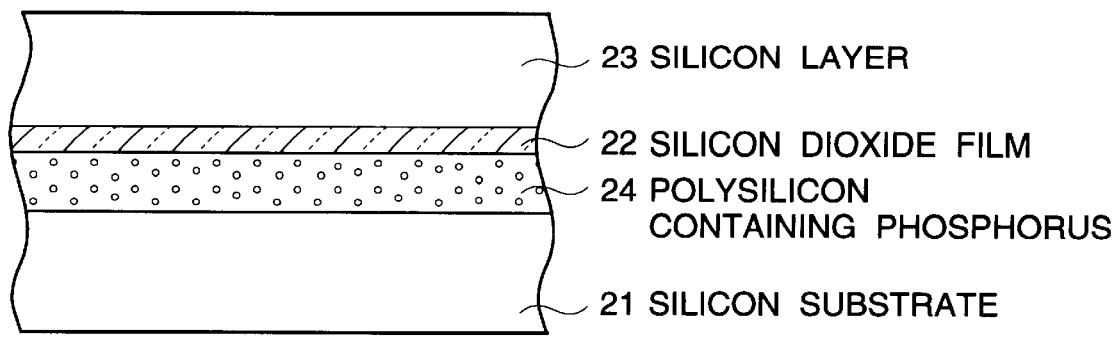
Figure 9C:
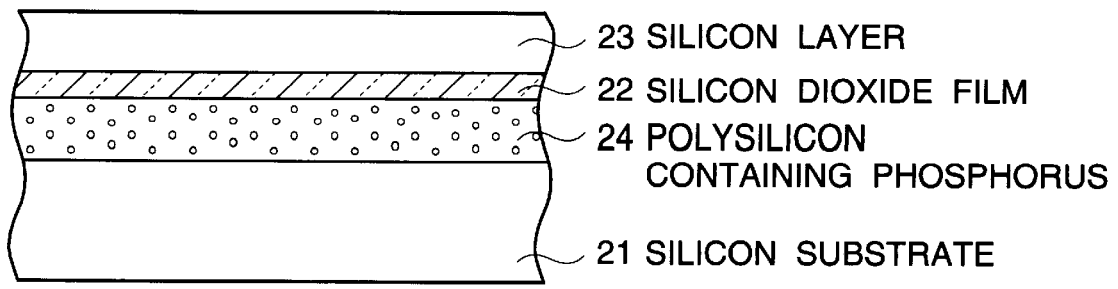

Referring to FIG. 9A and 9C, there are shown diagrammatic sectional views illustrating a process for forming the second embodiment of the SOI substrate in accordance with the present invention.

First, as shown in FIG. 9A, a polysilicon layer 24 containing phosphorus is formed on a silicon layer 21 constituted of a silicon substrate. This polysilicon layer 24 can be formed by utilizing, without modification, the process for forming the polysilicon layer 14A shown in FIG. 7.

Then, a silicon layer 23 constituted of another silicon substrate is prepared, and a lower surface of the silicon substrate is thermally oxidized to form a silicon dioxide film 22 having a thickness of about 0.1 μm to 1 μm.

Then, as shown in FIG. 9B, both the silicon substrates 21 and 23 are stuck to each other in such a manner that the polysilicon layer 24 is bonded to the silicon dioxide film 22, and a heat treatment is performed at 800° C. to 1000° C. for one hour to three hours, so that both the silicon substrates 21 and 23 become firmly integral.

Thereafter, as shown in FIG. 9C, the silicon layer 23 is ground to the thickness of about 0.1 μm to 3 μm, so that an active layer is formed. Thus, the SOI substrate is completed.

In the SOI substrate of the second embodiment, since the silicon dioxide layer 22 is formed directly under the silicon layer 23 used as the active layer, and since the polysilicon layer 24 containing the phosphorus is formed under the silicon dioxide layer 22, the polysilicon layer 24 can function as the gettering layer. In addition, the phosphorus is prevented from being diffused into the active layer 23 by action of the silicon dioxide 22. Furthermore, this SOI substrate is so configured that the getter layer 24 is located near to the active layer 23 used for device formation, the effective gettering effect can be expected at a low temperature.

Figure 10A:
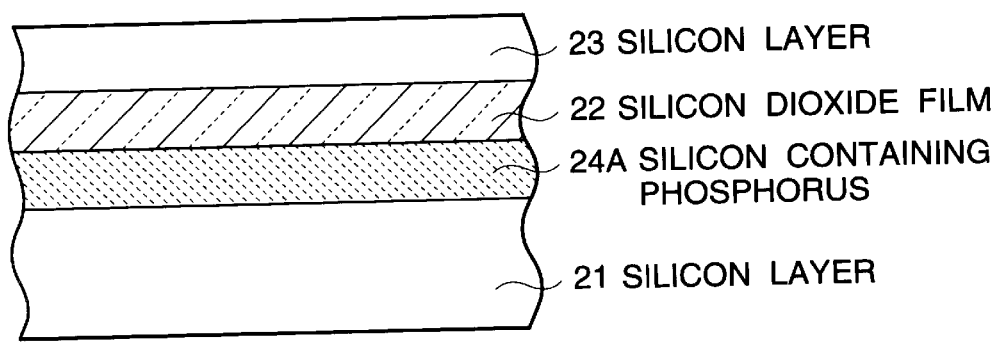
FIGS. 10A and 10B are diagrammatic sectional views of modifications of the second embodiment of the SOI substrate shown in FIG. 8.

The second embodiment of the SOI substrate shown in FIG. 8 can be modified to include a silicon layer 24A containing a high concentration of phosphorus, in place of the polysilicon layer 24, on the surface of the silicon layer 21 as shown in FIG. 10A.

Figure 10B:
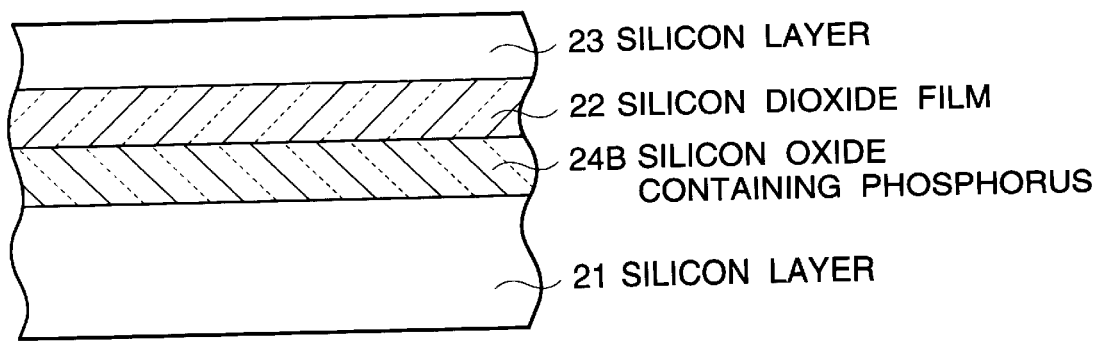

Alternatively, the second embodiment of the SOI substrate shown in FIG. 8 can be modified to include a silicon oxide layer 24B containing a high concentration of phosphorus, in place of the polysilicon layer 24, on the surface of the silicon layer 21 as shown in FIG. 10B. This modification can be realized by replacing the step of forming the polysilicon layer 24 shown in FIG. 9A, by a phosphorus diffusing or ion-implanting step and its succeeding thermal oxidizing step, or alternatively by a CVD process for forming a silicon oxide film containing the phosphorus. In this modification, a gettering effect similar to that of the SOI substrate shown in FIG. 8 can be obtained, but also, since the silicon oxide layers are stuck to each other, the heat treatment for the bonding can be performed at a low temperature, and therefore, slip or bowing of the silicon substrate can be reduced.

Figure 11:
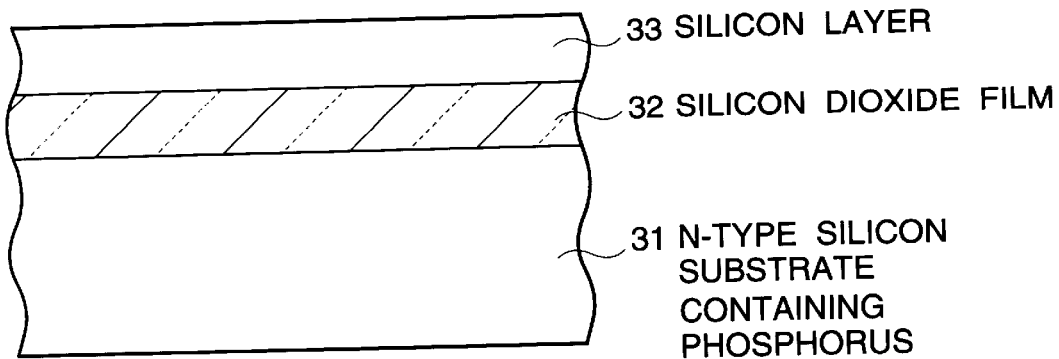
FIG. 11 is a diagrammatic sectional view of a third embodiment of the SOI substrate in accordance with the present invention.

Referring to FIG. 11, there is shown a diagrammatic sectional view of a third embodiment of the SOI substrate in accordance with the present invention. The third embodiment includes a silicon dioxide layer 32 having a thickness of about 0.1 μm to 1 μm, formed on a silicon layer 31 constituted of a thick N-type silicon substrate containing phosphorus therein, and a silicon layer 33 having a thickness of about 0.1 μm to 3 μm, formed on the silicon dioxide layer 32. A detailed explanation of the process for manufacturing the third embodiment of the SOI substrate will be omitted. In brief, for example, a surface of a silicon substrate 31 is thermally oxidized to form a silicon dioxide film 32, and another silicon substrate is prepared and stuck onto the silicon dioxide film 32, and firmly bonded by a heat treatment. Thereafter, the silicon layer 33 is ground to a predetermined thickness.

In this third embodiment, since the while of the thick N-type silicon layer 31 acts as the getter layer, sustaining gettering effect can be obtained for various heat treatment steps for many devices. On the other hand, since it is not necessary to form a layer containing therein phosphorus on a silicon substrate for the purpose of forming a getter layer, the manufacturing cost can be decreased.

Figure 12:
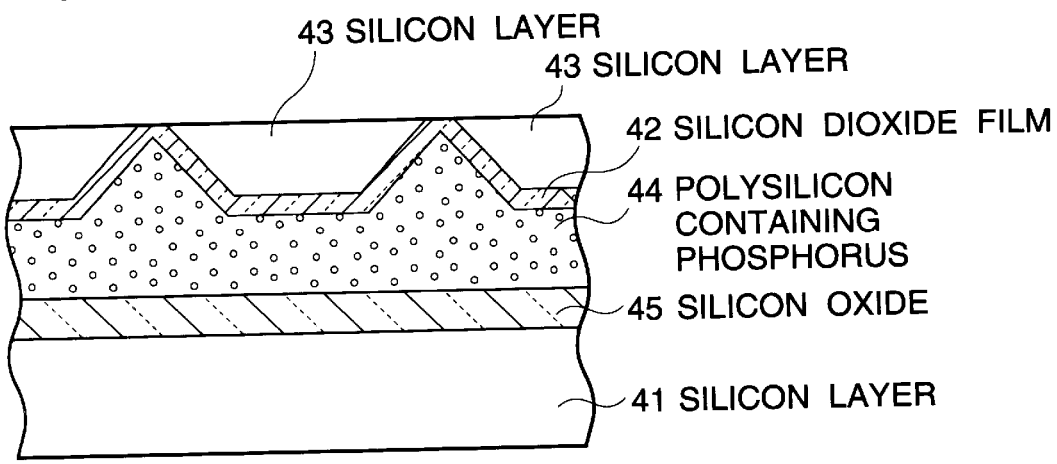
FIG. 12 is a diagrammatic sectional view of a fourth embodiment of the SOI substrate in accordance with the present invention.

Referring to FIG. 12, there is shown a diagrammatic sectional view of a fourth embodiment of the SOI substrate in accordance with the present invention. The fourth embodiment includes a silicon dioxide layer 45 formed on a silicon layer 41, and a polysilicon layer 44 containing phosphorus therein is formed on the silicon dioxide layer 45. On a surface of the polysilicon layer 44, a plurality of recesses are formed in the form of islands, and a silicon dioxide film 42 is formed to cover the surface of the polysilicon layer 44 including the plurality of island-like recesses. In addition, a silicon layer 43 is formed on the silicon dioxide film 42 in such a manner that the silicon layer 43 is divided into a plurality of active regions, each of which is located in one of the plurality of island-like recesses and partitioned by the island-like recesses so that each of the active regions is insulated from adjacent active regions by the silicon dioxide film 42. For example, the lower silicon dioxide layer 45 has a thickness of 1 μm to 2 μm, and the upper silicon dioxide layer 42 has a thickness of 0.1 μm to 1 μm.

Referring to FIG. 13A to 13D, there are shown diagrammatic sectional views illustrating a process for forming the fourth embodiment of the SOI substrate in accordance with the present invention.

Figure 13A:
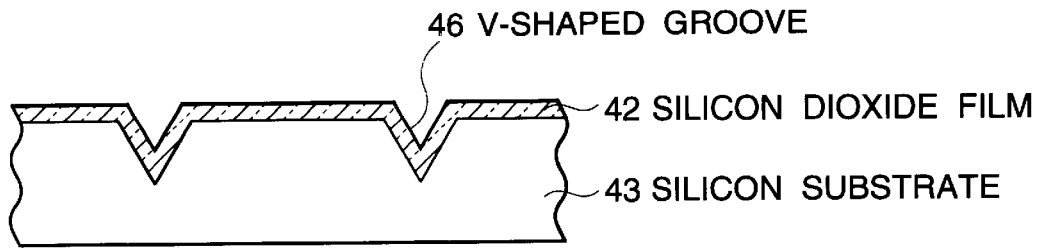
FIG. 13A and 13D are diagrammatic sectional views illustrating a process for forming the fourth embodiment of the SOI substrate shown in FIG. 12.

As shown in FIG. 13A, a lower surface (upper side in FIG. 13A) of a silicon substrate constituting the silicon layer 43 is etched to form a plurality of V-shaped or U-shaped grooves 46. This etching is an anisotropic etching using a KOH solution, or alternatively, an isotropic etching by means of a reactive etching. Then, a silicon dioxide film 42 having a thickness of 1 μm to 2 μm is formed on the grooved lower surface of the silicon layer 43.

Figure 13B:
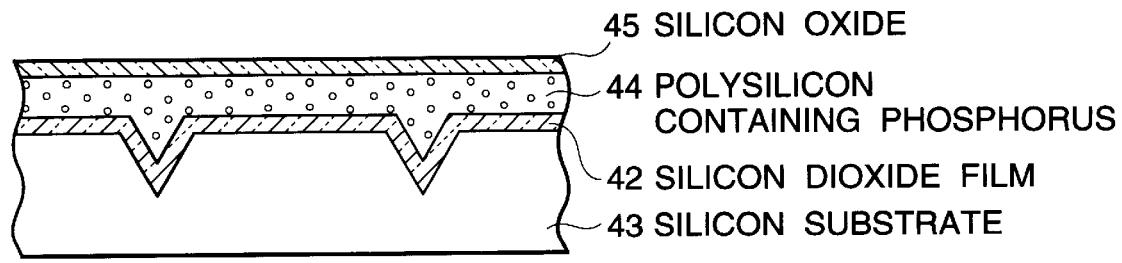

Thereafter, as shown in FIG. 13B, a phosphorus containing polysilicon layer 44 having a thickness of 1 μm to 2 μm is grown on the silicon dioxide layer 44, and a surface of the grown polysilicon layer 44 is ground to be planarized. Then, a silicon dioxide layer 45 having a thickness of 0.1 μm to 1 μm is formed on a surface of the polysilicon layer 44.

Figure 13C:
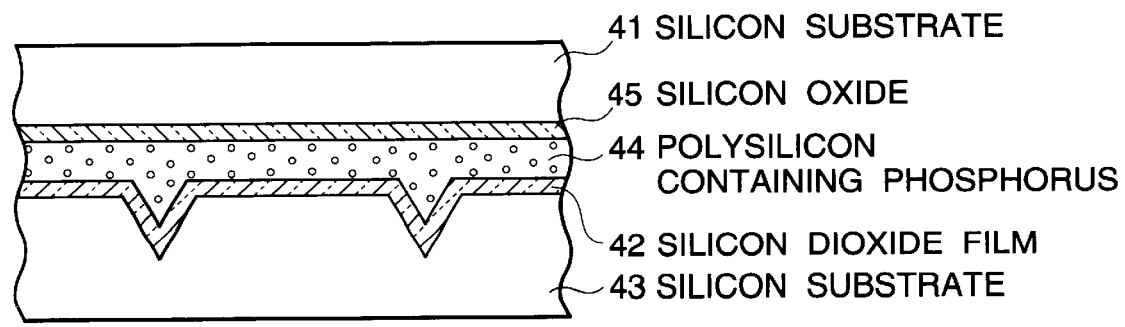

Furthermore, as shown in FIG. 13C, another silicon substrate constituting the silicon layer 41 is stuck on a surface of the silicon dioxide layer 45, and firmly bonded by a heat treatment.

Figure 13D:
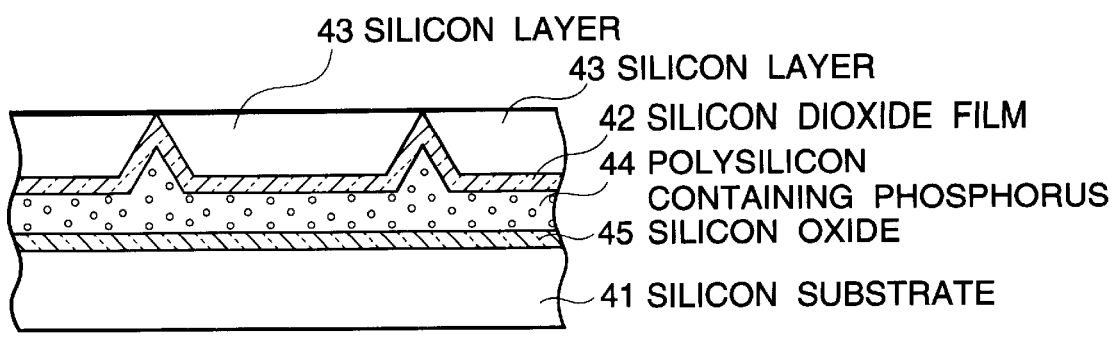

Thereafter, as shown in FIG. 13D, the silicon layer 43 is ground until a ridge of the silicon dioxide film 42 is exposed. Thus, the SOI substrate shown in FIG. 12 is completed.

In this fourth embodiment of the SOI substrate, the silicon dioxide layer 42 covers not only a bottom surface but also a side surface of each island regions of the silicon layer 43, and the polysilicon layer 44 acting as the getter layer extends over the silicon dioxide layer 42 corresponding to the bottom surface and the side surface of each island regions of the silicon layer 43. Therefore, the gettering effect for laterally diffusing heavy metals can be obtained.

Figure 14:
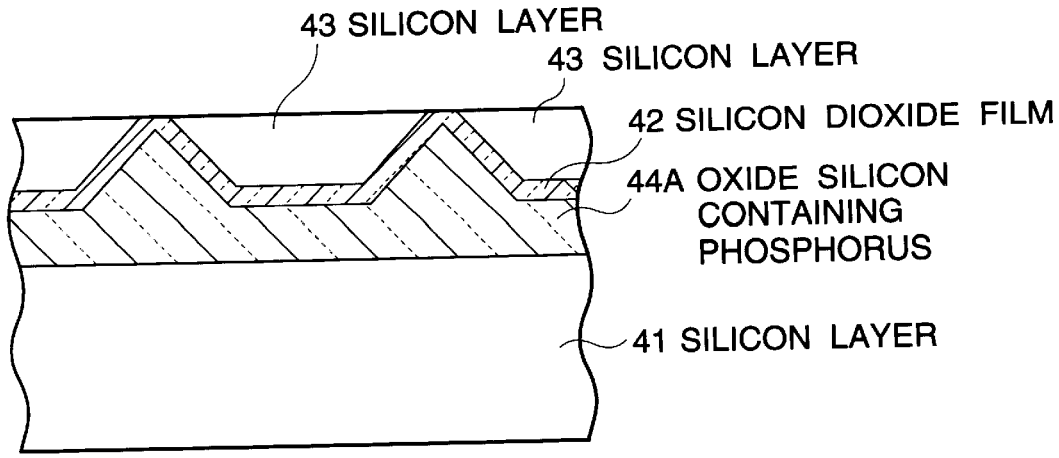
FIG. 14 is a diagrammatic sectional view of a modification of the fourth embodiment of the SOI substrate shown in FIG. 12.

The fourth embodiment of the SOI substrate shown in FIG. 12 can be modified to include a silicon oxide film 44A containing therein phosphorus, in place of the polysilicon layer 44 containing phosphorus therein, as shown in FIG. 14, the silicon layer 41 constituting a support substrate being stuck on the silicon oxide film 44A. This modification can be realized by substituting a step of forming a silicon oxide film 44A containing therein phosphorus, for the step of forming the polysilicon layer 44 in the manufacturing process shown in FIGS. 13A to 13D, and by bonding the silicon layer 41 to the silicon oxide film 44A. This formation of the silicon oxide film 44A can be realized by a plasma CVD process at 400° C. using for example a mixed gas of $SiH_4$ (60 sccm) gas+$N_2O$ (1000 sccm) gas+$PH_3$ (1500 sccm) gas.

In the modification of the SOI substrate shown in FIG. 14, a gettering effect similar to that of the fourth embodiment shown in FIG. 12 can be obtained, and also, the heat treatment for the bonding can be made at a low temperature. Accordingly, the manufacturing can be made easy, and the diffusion of the phosphorus in the manufacturing process can be prevented.

In all the above mentioned embodiments, the getter layer has been formed of phosphorus, but a similar getter layer can be formed by using other impurity such as boron and arsenic. In other words, the applicant of the present application confirmed that when the getter layer is formed by using boron and arsenic, an effect similar to the effect of the above mentioned embodiments can be obtained.

As seen from the above, the SOI substrate in accordance with the present invention is characterized in that the buried silicon oxide layer is provided directly under the silicon layer used as the active layer, and the layer containing therein a high concentration of impurity such as phosphorus, boron or arsenic, is formed at the side of the buried silicon oxide layer opposite to the side adjacent to the silicon active layer. In this structure, since the layer containing therein a high concentration of impurity acts as the getter layer, an effective gettering of heavy metals can be obtained in wide temperature range from a low temperature region to a high temperature region. In addition, since the silicon oxide layer is provided directly under the silicon layer used as the active layer, and since the silicon oxide layer exists between the silicon active layer and the layer containing therein a high concentration of impurity, the diffusion of the impurity into the active layer is effectively prevented, and therefore, the impurity scarely diffuses to the active layer, so that the device manufactured is subjected to almost no adverse influence of the diffusion of the impurity.

The first embodiment of the SOI substrate in accordance with the present invention is characterized in that the silicon oxide film is formed on the upper surface of the silicon layer acting as the support substrate, the silicon layer is formed as the active layer on the surface of the silicon oxide film, and the layer containing impurity therein is provided on the lower surface of the silicon layer acting as the support substrate. In this embodiment, in order to form the layer containing impurity therein, it is sufficient for example if the phosphorus glass is formed on the silicon layer so that the phosphorus is caused to diffuse into the silicon layer, or alternatively if the polysilicon layer containing phosphorus therein is formed on the silicon layer. In the case of forming the phosphorus diffusing layer, since the process for manufacturing the conventional SOI substrate can be utilized, the manufacturing of the SOI substrate can be simplified. In the case of forming the polysilicon layer containing phosphorus therein, the gettering effect of the polysilicon layer is added, so that the total gettering effect is elevated.

The second embodiment of the SOI substrate in accordance with the present invention is characterized in that the layer containing impurity therein is formed on the upper surface of the silicon layer acting as the support substrate, the silicon oxide layer is formed on the surface of the layer containing impurity therein, and the silicon layer is provided as the active layer on the surface of the silicon oxide layer. With this construction, the gettering effect can be elevated, and the manufacturing can be made easy. In addition, since the getter layer is located near to the active layer where the device is to be formed, the gettering effect at a low temperature can be expected. Furthermore, if the layer containing impurity therein is formed of a silicon dioxide layer, the heat treatment for bonding the silicon substrates together can be performed at a low temperature, so that the slip and the bowing of the silicon substrate can be decreased.

The third embodiment of the SOI substrate in accordance with the present invention is characterized in that the silicon oxide film is formed on the surface of the thick N-type silicon layer containing phosphorus therein, and the silicon layer is formed as the active layer on the surface of the silicon oxide film. In this structure, since the thick N-type silicon layer acts as the getter layer, a sustaining gettering effect can be obtained for various heat treatment steps for many devices. On the other hand, since it is not necessary to form a layer containing therein phosphorus on a silicon substrate for the purpose of forming a getter layer, the manufacturing cost can be decreased.

The fourth embodiment of the SOI substrate in accordance with the present invention is characterized in that the layer containing impurity therein is formed on the upper surface of the silicon layer acting as the support substrate, the island-like recesses are formed on the surface of the layer containing impurity therein, the silicon oxide layer is formed on the surface including the island-like recesses, and the silicon layer is formed as the active layer in the island-like recesses on the surface of the silicon oxide film. In this embodiment, the silicon dioxide layer covers not only a bottom surface but also a side surface of each island-like active layer region, and the polysilicon layer acting as the getter layer extends over the silicon dioxide layer corresponding to the bottom surface and the side surface of each island-like active layer region. Therefore, the gettering effect for laterally diffusing heavy metals can be obtained. In addition, if the layer containing impurity therein is formed of a silicon dioxide layer, the heat treatment for bonding the silicon substrates together can be performed at a low temperature, so that the manufacturing can be made easy, and the diffusion of the impurity in the manufacturing process can be prevented.

Furthermore, the first to fourth embodiments of the SOI substrate can be manufactured by a reduced number of manufacturing steps.

The invention has thus been shown and described with reference to the specific embodiments. However, it should be noted that the present invention is in no way limited to the details of the illustrated structures but changes and modifications may be made within the scope of the appended claims.

I claim:

1. A silicon-on-insulator substrate comprising an active silicon layer, a buried silicon oxide layer formed directly under said active silicon layer, and an impurity layer containing a high concentration of impurity therein and formed under said buried silicon oxide layer.

2. A silicon-on-insulator substrate claimed in claim 1 wherein said impurity layer is formed of a silicon layer containing a high concentration of impurity therein.

3. A silicon-on-insulator substrate claimed in claim 2 further including a silicon substrate layer between said buried silicon oxide layer and said impurity layer.

4. A silicon-on-insulator substrate claimed in claim 2 further including a silicon substrate layer formed under said impurity layer.

5. A silicon-on-insulator substrate claimed in claim 1 wherein said impurity layer is formed of a polysilicon layer containing a high concentration of impurity therein.

6. A silicon-in-insulator substrate claimed in claim 5 further including a silicon substrate layer between said buried silicon oxide layer and said impurity layer.

7. A silicon-on-insulator substrate claimed in claim 5 further including a silicon substrate layer formed under said impurity layer.

8. A silicon-on-insulator substrate claimed in claim 1 wherein said impurity layer is formed of a silicon oxide layer containing a high concentration of impurity therein.

9. A silicon-on-insulator substrate claimed in claim 8 further including a silicon substrate layer formed under said impurity layer.

10. A silicon-on-insulator substrate claimed in claim 1 wherein said impurity layer is formed of an N-type silicon substrate containing a high concentration of impurity therein.

11. A silicon-on-insulator substrate claimed in claim 1 wherein said impurity layer has a plurality of recesses formed on an upper surface thereof, and said silicon oxide layer is formed to cover said upper surface of said impurity layer including said plurality of recesses, and wherein said active silicon layer is divided into a plurality of active regions each located in and partitioned by one of said plurality of island-like recesses.

12. A silicon-on-insulator substrate claimed in claim 1 wherein said impurity contained in said impurity layer is one selected from the group consisting of phosphorus, boron and arsenic.

* * * * *